United States Patent
Olsson

(10) Patent No.: US 7,028,048 B1
(45) Date of Patent: Apr. 11, 2006

(54) METHOD FOR DIVIDING A COORDINATE SYSTEM INTO A PLURALITY OF INTERVALS BASED ON THE DISTRIBUTION OF OBJECTS REPRESENTED WITHIN THE COORDINATE SYSTEM

(75) Inventor: Bertil Olsson, Kärna (SE)

(73) Assignee: Jema-Jori AB, Karna (SE)

( * ) Notice: Subject to any disclaimer, the term of this patent is extended or adjusted under 35 U.S.C. 154(b) by 542 days.

(21) Appl. No.: 10/019,891

(22) PCT Filed: Jul. 6, 2000

(86) PCT No.: PCT/SE00/01440

§ 371 (c)(1),
(2), (4) Date: Apr. 29, 2002

(87) PCT Pub. No.: WO01/04795

PCT Pub. Date: Jan. 18, 2001

(30) Foreign Application Priority Data

Jul. 9, 1999 (SE) .................................... 9902639

(51) Int. Cl.
*G06F 17/30* (2006.01)
(52) U.S. Cl. ............................ 707/103; 707/100; 707/6
(58) Field of Classification Search ................ 707/103, 707/100, 6
See application file for complete search history.

(56) References Cited

U.S. PATENT DOCUMENTS

| 5,652,881 A | 7/1997 | Takahashi et al. |
| 5,903,893 A | 5/1999 | Kleewein et al. |
| 6,505,205 B1 * | 1/2003 | Kothuri et al. ............. 707/100 |

FOREIGN PATENT DOCUMENTS

EP  0723247 A1  7/1996

* cited by examiner

*Primary Examiner*—Leslie Wong
*Assistant Examiner*—Thanh-Ha T. Dang
(74) *Attorney, Agent, or Firm*—Harness Dickey & Pierce, P.L.C.

(57) ABSTRACT

A method for handling a database containing objects extending into a coordinate system, representing a multidimensional reality. The coordinate system is divisible into a plurality of defined, multidimensional intervals. Each time an object is entered into the database, the method determines the multidimensional intervals into which the object extends. For each of these intervals, the method determines the number of objects extending into the interval and compares the number of objects with a predetermined threshold value. If the threshold value is exceeded, the interval is divided into at least two smaller intervals, in order to limit the number of objects within any interval. Each interval is linked to a set of objects extending into that interval, and each object is linked to a set of intervals into which the object at least partly extends.

21 Claims, 5 Drawing Sheets

METHOD FOR DIVIDING A COORDINATE SYSTEM INTO A PLURALITY OF INTERVALS BASED ON THE DISTRIBUTION OF OBJECTS REPRESENTED WITHIN THE COORDINATE SYSTEM

This application is the National Phase under 35 USC §371 of PCT International Application No. PCT/SE00/01440 which has an International filing date of Jul. 6, 2000, which designated the United States of America, the entire contents of which are hereby incorporated by reference.

TECHNICAL FIELD

The present invention relates to a method for handling a database containing objects that have an extension in a coordinate system representing a multidimensional reality, which coordinate system is divisible into a plurality of defined, multidimensional intervals.

BACKGROUND ART

Various forms of databases for storing information exist very often in our increasingly computerised world. Information is usually structured in the database in the form of objects which, for instance, may represent a physical article whose properties are stored in the database.

When transferring the physical reality to a database, software comprising a graphical interface is often used, models being drawn into a coordinate system and stored in the database by the software. This is called "writing" or "entering" the model into the database. One or more models are linked to an object, which may also be linked to information about the properties, choice of material, etc. of the object. The geometric models and other properties are stored in documents that are linked to an object by means of references to an object ID. This type of system is well known in CAD (Computer Aided Design), for instance.

The information in the database is used in calculations performed by the designer, such as strength calculations, optimisation calculations, collision analyses, etc. When the space is large in relation to the object, the number of objects may be extremely large. One problem arising out of this is that, before each calculation, the system takes all the objects in the space into consideration. This is often completely wasted effort since normally only a few neighbouring objects affect a calculation that is being performed.

Considerable differences may also exist between the degree of detail for different objects. A flat wall may perhaps be modelled sufficiently well by a single object, say a rectangular parallelepiped. A clock hanging on the wall, on the other hand, may be accurately modelled and therefore contain a large number of small components.

A traditional solution to this problem is for the system to divide the objects into hierarchical levels or scales. Small parts are grouped in a combined object that can be represented with less information. The clock may contain a number of objects on a smaller scale, for instance, all of which represent a particular component in the clock. On a larger scale the whole clock is represented by a single object corresponding only to its outer geometry, for instance. The smaller scale is "hidden" from a designer working on the larger scale since he/she only needs to make use of relations between objects on the larger scale. Similarly, the relations on the larger scale are deactivated when work is being performed on the smaller scale.

This manner of handling the problem is unsatisfactory for several reasons. In the first place, the user can only work in one scale at a time, which entails problems when properties of an object influence objects on a smaller or larger scale. For example: if the clock mentioned above has a suspension hook in the smaller scale, this may affect the force that in the larger scale holds the clock on the wall. A change in the hook thus affects a relation higher up in the hierarchy. This relationship is not apparent if the work is limited to one scale at a time.

In the second place, it is difficult to draw limits as to which objects may be permitted on a particular scale. Different applications may have different suitable divisions, resulting in deficient or non-existent compatibility.

According to known technology the space is divided into a large number of part-volumes which are stored in the database. Each object may extend into several part-volumes and, for each part-volume, the database stores which objects are at least partially in this part-volume. In this case a calculation performed for one point in the space need only be affected by information relating to objects in the small part-volume that includes the relevant point. Naturally, if the calculation relates to an object extending over several part-volumes, information from the objects in all these part-volumes is involved. On the other hand, information relating to objects located in part-volumes entirely separate from the relevant part-volume need not be included in the calculation, and the system therefore avoids numerous unnecessary operations.

The drawback with this system is that it is completely static. In a volume with a few large objects, such as a wall, a large number of part-volumes will only contain reference to a single object. However, in the case of an object with many small parts, such as a clock, a part-volume may contain a very large number of references. Consequently, a calculation such as a collision calculation, performed somewhere on the wall, will comprise considerably more calculation phases if it is performed for any of the part-volumes near the clock than if it is performed for an empty wall surface, although the calculation is not necessarily affected by the clock.

It could be said that the system solves the problem of different hierarchical levels by locking the entire coordinate system to a specific level that is assumed to be sufficiently small. Unfortunately, problems arise with part-volumes containing information of very different type—quite simply an unbalance in the mathematics defining the coordinate system and the objects placed in it. This results in extremely demanding calculations for collision or optimisation analysis, for instance.

OBJECT OF THE INVENTION

One object of the present invention is to provide a dynamic, automatically optimising division of a space map, i.e. a multidimensional "room" represented by a coordinate system.

A second object of the invention is to provide a dynamic database.

A third object of the invention is to provide a database allowing anyone easily to obtain information as to which objects are located in the proximity of an object.

SUMMARY OF THE INVENTION

The present invention relates to a method of the type described by way of introduction further characterised by, every time an object is entered into the database, determining which multidimensional intervals the object has an extension in, for each of these intervals determining the number of objects having an extension therein, comparing said number of objects with a predetermined threshold value and, if the threshold value is exceeded, dividing the interval into at least two smaller intervals, in order to limit the number of objects related to an extension in an optional defined interval.

It is thus ensured that only as many objects as indicated by the threshold value exist in each interval. In parts of the interval where many small objects are situated, the interval is divided into a large number of small sub-intervals. In parts of the interval where only a few objects are situated, however, the interval is divided into larger sub-intervals.

In accordance with a preferred embodiment, the method also includes the step of associating each interval with a set of objects that are related to an extension in the interval.

The method of dynamically dividing an interval into several smaller intervals in accordance with the invention is used to obtain a dynamic space map in which each object is associated with at least one interval, and in which several intervals are associated with at least one object. Information as to how interval and object are related to each other can be used to obtain important information as to the relation between the objects. The size of an interval, for instance, indicates how close its objects are in relation to other, adjacent intervals.

An immediate advantage of this type of database is that various areas of the multidimensional space map are divided into different numbers of intervals, depending on how many and how small the objects are that are related to each area.

The coordinate system may comprise at least one time dimension and one or more, preferably three, spatial dimensions. This is advisable in order to satisfactorily reproduce the reality represented by the coordinate system.

Each division of an interval is preferably only effected in one dimension. Better control is obtained over the new intervals created by only dividing in one dimension at a time.

When the threshold value is exceeded the interval is preferably divided into two smaller intervals, suitably into two intervals of equal size. This way of repeatedly halving intervals is extremely suitable for implementation in a computer, using binary arithmetic.

BRIEF DESCRIPTION OF THE DRAWINGS

The present invention will be described in more detail in the following with reference to the accompanying drawings illustrating preferred embodiments of the invention by way of example.

DESCRIPTION OF A PREFERRED EMBODIMENT

Figure 1:
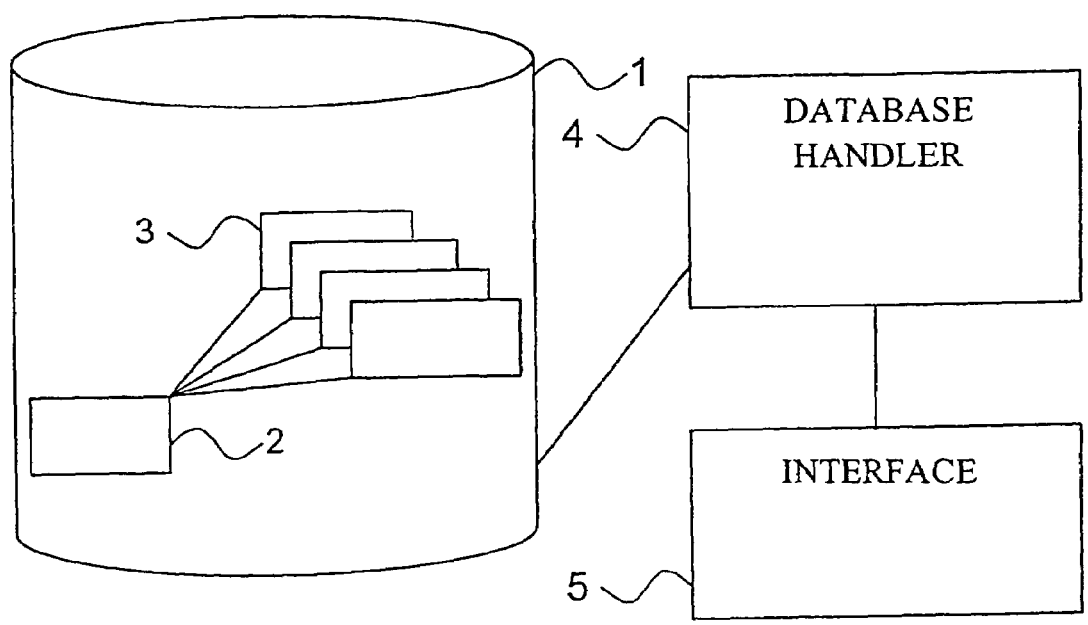
FIG. 1 illustrates schematically an environment in which the method in accordance with the invention is used.

The method in accordance with the invention is applied in a computer environment comprising a database 1 with a plurality of objects 2. Each object is linked (e.g. by pointers) to one or more documents 3 describing the object. First software 4 to handle the objects in the database and second software 5 comprising a user interface are also shown. Said first and second software units may naturally be integrated in a software unit 6 and will be referred to generally in the following as the "software" 6.

The software 6 permits a user to create, edit and remove objects 2, and continuously handles the database in accordance with the changes and in accordance with a specific structure. The software 6 is also arranged, for instance, to be able to perform searches in the database and handle relations between objects. An environment of this type occurs in a multitude of applications, such as CAD or the global database called WWW.

The method in accordance with the invention is intended to be implemented in the software 6 or in separate software cooperating with one or more databases.

When an object is entered into the database it is linked to a model created previously, possibly via a transformation matrix defining how the object is oriented in relation to the model. The object then comprises the existence of a model in a coordinate system and it can be said that the object has an extension in the coordinate system.

In a simple case the coordinate system, representing a multidimensional reality, comprises the three spatial dimensions, but in accordance with a preferred embodiment it also includes time and one or more abstract dimensions which may represent alternative embodiments of a component or a process, for instance.

In accordance with one embodiment of the invention, every object is linked to one or more intervals of the coordinate system, with the same number of dimensions as the coordinate system. At the same time, the database includes a plurality of interval-objects, each of which is linked to one or more objects.

Figure 2:
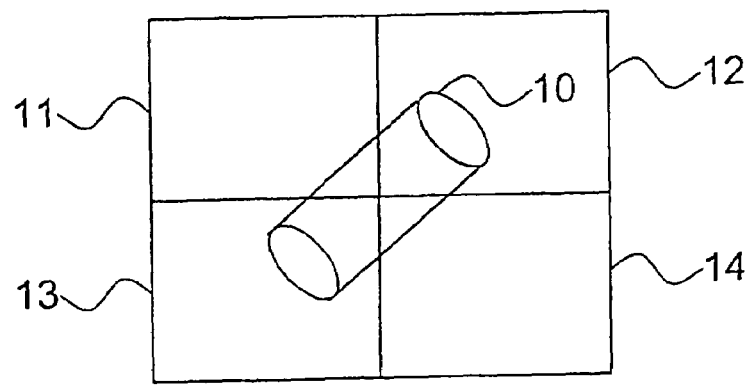
FIG. 2 shows an object entered in a coordinate system that is divided into four intervals.
Figure 3:
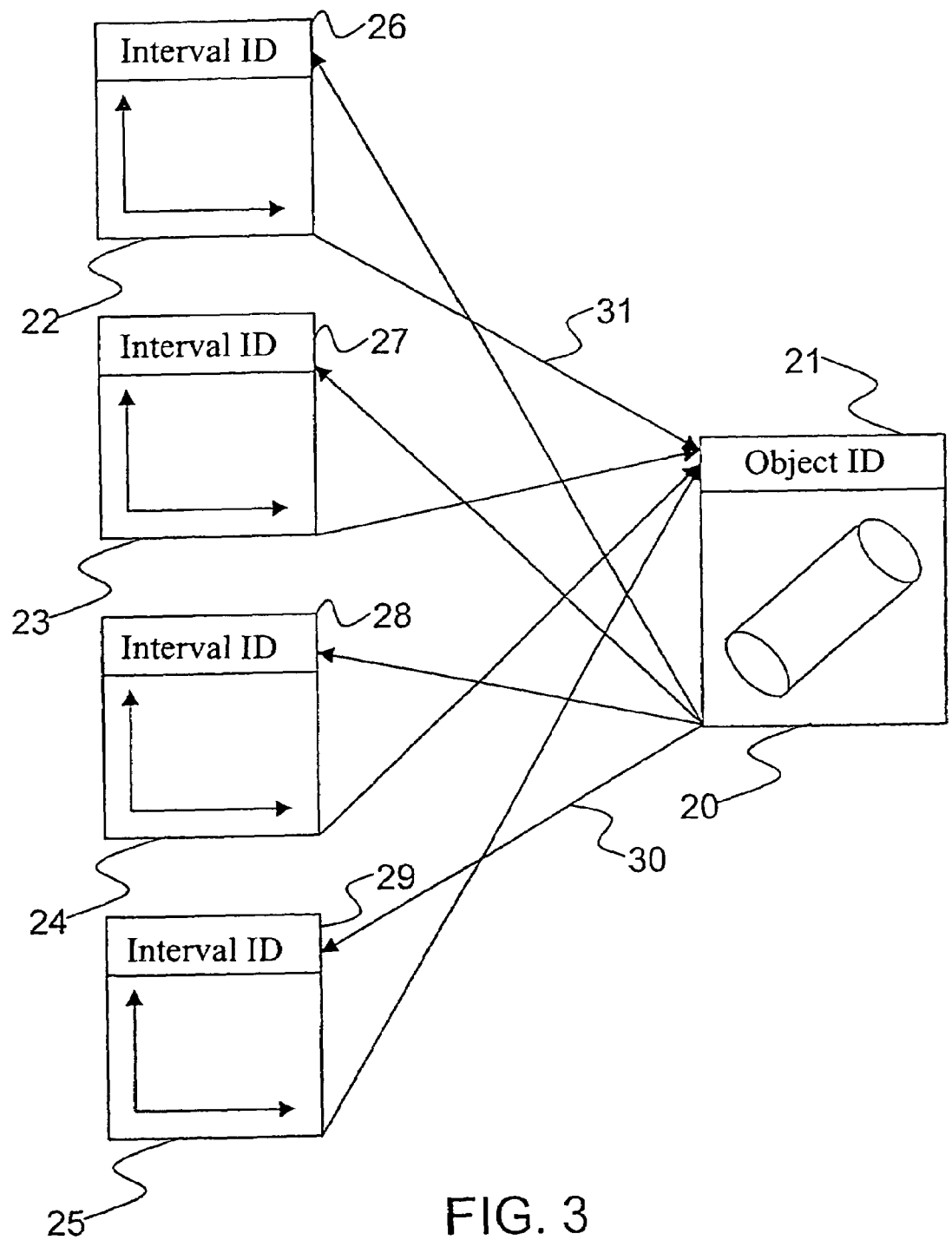
FIG. 3 shows schematically how an object is linked to several interval objects, and how each interval ID is linked to an object ID.

FIG. 2 shows how a model 10 is entered into a coordinate system that is divided into four intervals 11–14, equal in size, and FIG. 3 illustrates how the model and the interval are represented in the database 1. The model 10 is represented in the database 1 by an object 20 with an object ID 21. Each interval 11–14 is represented in the database by an interval-object 22–25, assigned interval ID 26–29. The object 20 is linked to the four interval-objects 22–25, preferably by pointers 30 to the interval-objects ID 26–29. Similarly, each interval-object 22–25 is linked to the object 20, preferably by means of pointers 31 to the object ID 21.

Thus, every time an object is entered into the database, it is assigned a reference (pointer) to one or more interval-objects. Each of these interval-objects is then assigned a reference to the relevant object. The intervals are determined so that they fully encompasse the extension in the coordinate system to which the object is related, and at the same time the number of objects that each interval is associated with is limited to a specific threshold value.

The method of dividing the intervals is described in the following with reference to FIGS. 4–5.

In step 41 an object 20 is entered into the database. A comparison of the extension of the object 20 with the interval-object 22–25 of the database determines the intervals within which the object 20 has an extension (step 42), and steps 43–44 are performed for all these intervals.

The number of objects occurring in the relevant interval is determined in step 43. In the preferred embodiment of the invention described here, this can be read from the database, since each interval-object is linked to a set of objects. If the database lacks this structural construction, for all objects in the database the software 6 can check whether they have an extension in the relevant interval.

In step 44 this number is compared with the threshold value. If the threshold value is not exceeded the program control will continue to step 45 which sees to it that steps 43–44 are repeated for all intervals identified in step 42. If, on the other hand, the threshold is exceeded the program control will be moved to step 46 where the interval is divided into two intervals. The program control then returns to step 42 to decide if the object has an extension in both these intervals or only one of them. Steps 43 and 44 are then repeated in one or both the intervals.

When the program control reaches the end, each interval has only as many object references (i.e. occurrences of an object) as stated by the threshold value. In a preferred embodiment a minimum interval size is defined in order to limit the division routine. More objects may then admittedly occur in an interval than is stated by the threshold value, but this limitation greatly facilitates handling of the database since a smallest constituent is well defined.

Figure 4:
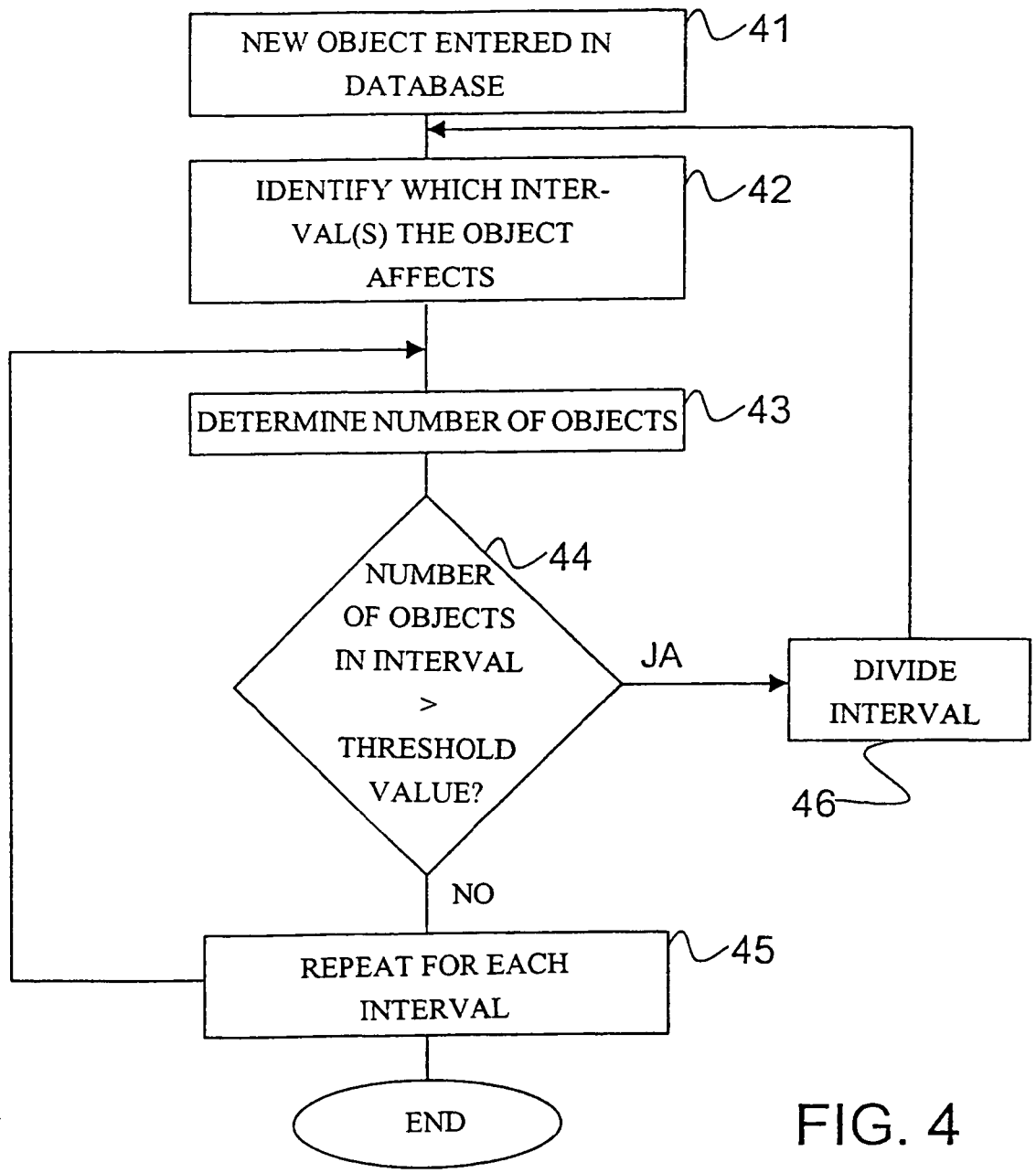
FIG. 4 shows a flow chart illustrating one embodiment of the invention.

The flow chart in FIG. 4 consists of two loops (steps 43–45 and steps 42–44) which can be woven into one another in a complicated manner depending on how the interval is divided. However, this can be solved by simple programming and is not described in more detail here.

Figure 5:
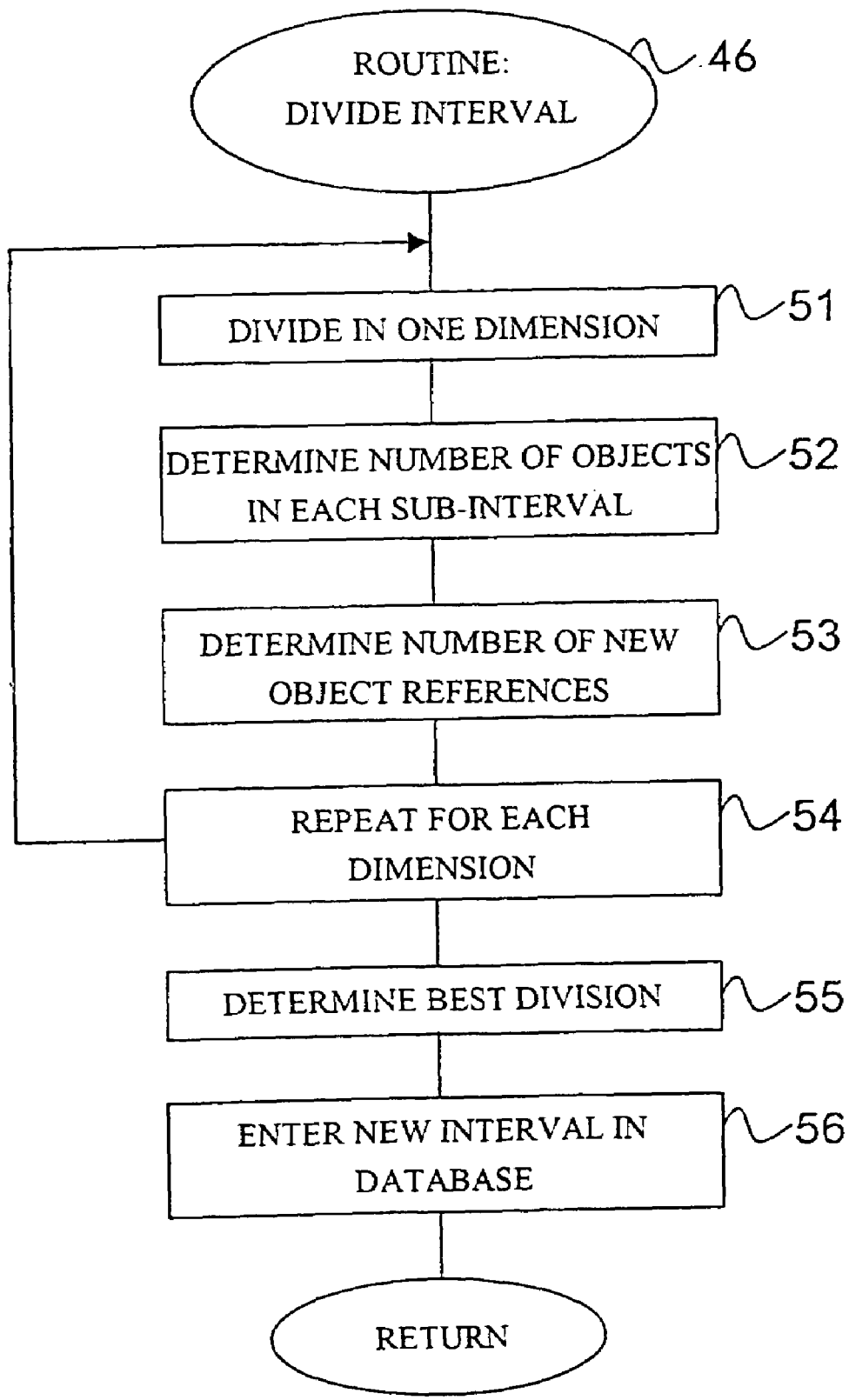
FIG. 5 shows a flow chart of the step of dividing an interval as shown in FIG. 4.

Division of the interval 31 in step 46 may take place as shown in the flow chart in FIG. 5.

The interval under consideration is first divided in one dimension (step 51) by the software, so that two new sub-intervals are formed. For each interval, therefore the number of objects occurring in each interval is determined (step 52), and the number of object references that occur (step 53), i.e. the number of pointers from one of the intervals to an object. This is repeated for each dimension in the coordinate system (step 54).

Step 55 then determines which division will give the best result, i.e. in which dimension the division shall be performed. The definition of "best" division may be formulated, for instance, so that the number of new object references is minimised while, at the same time, the distribution of objects between the sub-intervals is as even as possible. Other formulations are feasible, depending on the structure striven for in the database.

When the software has determined which division is best, these two sub-intervals are entered into the database in the form of interval-object (step 56), whereupon the program control returns to step 42 (FIG. 4).

Figure 6:
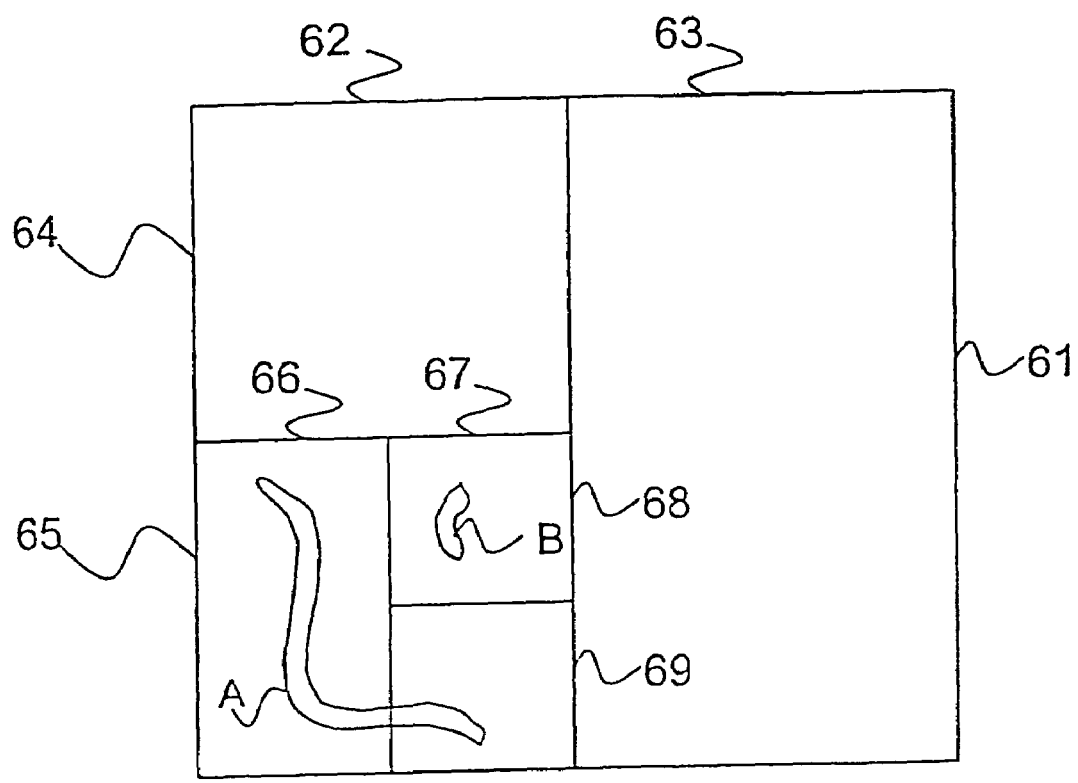
FIG. 6 shows a division of an interval into a two-dimensional coordinate system in accordance with the invention.

The following is a description, referring to FIG. 6, of an example of the division of a two-dimensional coordinate system, with a threshold value equal to one. The procedure is exactly analogous in the case of several dimensions or with a higher threshold value.

An object A is created in the database and assigned an object ID. Since the object is alone in the interval 61 it is linked to this interval 61 by a pointer. The interval 61 is linked to the ID of the object A in similar manner.

A second object is then entered into the coordinate system, thereby creating another object, B, which is assigned an object ID (step 41). Upon comparison of the extension of the object B with the interval-object of the database it is determined in which intervals the object B has an extension (step 42) and only the interval 61 is encountered in the example.

Since, in the example, the object B also occurs in interval 61, it is established in step 44 that the threshold value, set to one, has been exceeded. The interval 61 is therefore divided in one dimension (step 46) into two sub-intervals 62, 63 (two rectangles), which are entered into the database as two new interval-objects. A new analysis of the extension of the object B in both intervals (step 42) reveals that the object only occurs in the left interval 62. However, object A also occurs there and a new division (step 46) is therefore commenced. Two more interval-objects are therefore entered into the database, which intervals are formed by dividing the left interval in y-direction into two sub-intervals 64, 65, which gives a similar result. The next division then occurs in x-direction, forming intervals 66 and 67, the object A including coordinate points in both intervals 66 and 67. The analysis now reveals that the object B only occurs in interval 67 and that this interval also includes an extension of object A and must therefore be divided further. The interval 67 is divided in y-direction into sub-intervals 68 and 69, so that only one object occurs in each sub-interval.

In the above example a choice was made several times concerning the dimension (x or y) in which an interval should be divided. This choice is effected in accordance with the method described above with reference to FIG. 4. In the example, the above definition of "best" means that if possible an object occurs in each interval and that otherwise as few new object references as possible are created. (Since new object references in accordance with the above are created every time a new sub-interval is formed where an object occurs, more new object references are created when a division occurs through an object.)

The original coordinate system has thus been divided into a plurality of intervals 61–69, all of which are represented by interval-objects in the database. Each object A, B is also linked to a set of intervals. The set for the object A comprises intervals 61, 65 which constitute the quadratic intervals encompassing the whole object, and also intervals 66 and 69, since these are the two final sub-intervals in which the object occurs. The set for the object B also comprises intervals 61 and 65, for the same reasons as above, and also the interval 8 which encompasses the whole object and is not further divided. Similarly several intervals 65–69, that include a part of the objects A, B, are linked to respective objects by a pointer. Intervals 61 and 65 are linked to both objects A, B, intervals 66 and 69 to object A and, finally, interval 68 to object B.

Each interval-object suitably has an ID containing information as to where the interval is located in the coordinate system, and also concerning its extension in each dimension. The interval-object may, for example, have an ID such as $k_1, k_2, \ldots, k_N, \Delta_1, \Delta_2, \ldots \Delta_N$, where ki denotes a coordinate value in dimension i, and $\Delta i$ denotes the size of the interval in dimension i.

In the binary number system a pair consisting of coordinate value and extension in one dimension can be depicted by using one number for the coordinate value and one for the extension. This is illustrated in FIGS. 7a and 7b.

The interval 71 is divided into a plurality of sub-intervals 72–73 of different sizes. The smallest interval has a length one, and is equivalent to the abovementioned smallest defined interval size. Since the smallest interval size is known, every possible interval starting point can be given a coordinate, between 0 and 1111 (=15 in the decimal system) in the example. Note that the furthermost point (10000 binary, 16 decimal) of the interval 71 cannot constitute the starting point for a sub-interval of the interval 71. The length of each sub-interval is depicted as a multiple of the smallest interval length.

Figure 7A:
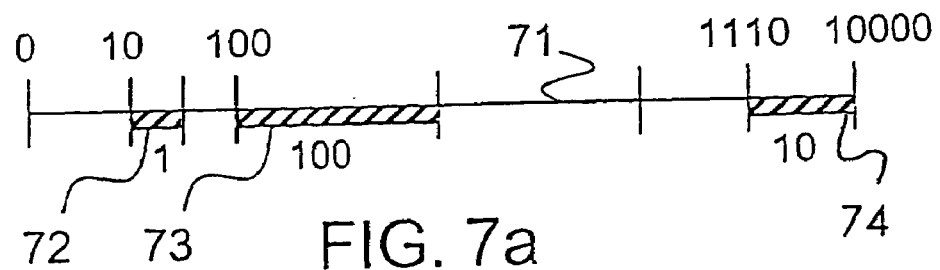
FIGS. 7a–7b show a binary notation of a dimension of an interval in accordance with one embodiment of the invention.
Figure 7B:
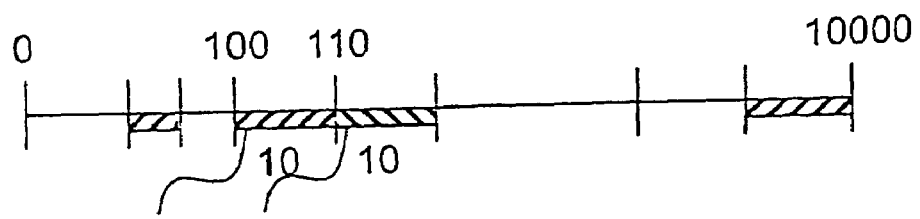

Three intervals 72–74 are marked in FIG. 7*a*:

Interval 72 starts at point 10 (2 in decimal system), and is 1 long.

Interval 73 starts at point 100 (4), and is 100 (4) long.

Interval 74 starts at point 1110 (14), and is 10 (2) long.

In FIG. 7*b* the interval 73 has been divided into two intervals 75, 76. Their respective designations are obtained from the designation of interval 73 by dividing the length in half (striking one zero in the binary notation, 100→10), so that two starting points are formed, one being identical to the starting point (100) of the interval 73, and the other equal to the starting point of the interval 73 plus the new interval length (100+10=110).

The structure of interval-objects in the database can be utilised to obtain information as to how close other objects are to an object, or the likeliest location of its nearest neighbouring object. Since the object is linked to interval IDs for the interval-objects in which it extends, it is sufficient to observe these interval IDs to obtain information concerning their extension. A part of the object lying in an interval with slight extension must be relatively close to another object, which has caused this sub-division of the interval.

By having one of the dimensions represent time, and having each object linked to a time extension, i.e. a time interval when they exist in a specific place, the database in accordance with the invention can be used to divide a dynamic process in time. Movement of an object takes up a corridor in the time space, known as an envelope. According to the invention, when two envelopes collide, these can be divided with respect to time to determine whether a collision really does occur between the two objects. One condition is that the object is linked to a plurality of IDs, each of which is connected to a time interval and a position.

One of the dimensions of the coordinate system may be an abstract dimension representing alternative embodiments of an object or process. Two objects may then be in the same place at the same time but as different, mutually exclusive alternatives.

The structure can also be used to distribute the contents in a database over several units, e.g. files or storage units. This division may then be based on areas of the coordinate system, so that one unit contains all the interval-objects relating to intervals forming a part of this area, the largest interval-object referring to the whole area.

It is also preferred for all objects in the database to have an object ID that includes the coordinates for one of the coordinate points of the object. All objects are then suitably stored in the unit where the interval-object containing the ID coordinate of the object is stored.

When the space map is divided in accordance with the present invention, the database units can also be correspondingly altered. A second threshold value, for instance, may define how many objects may be stored simultaneously in one unit. This threshold value is determined by the properties of each database. When this threshold value is exceeded, half the area connected to this unit is moved to another unit, such as another file, another disk or a completely different physical unit.

A database is thus created in which each unit is logically connected to a specific area of the coordinate system representing the reality depicted in the database. This is advantageous in many applications, such as design work, mining, World Wide Web, stock databases, etc.

The close connection of the database structure to the time-spatial extension of the object makes it particularly suitable in applications when time and space play a decisive role. An example is booking systems for travel. By stating time, starting place and destination, an interface can easily pick out suitable trips. In agriculture, many small areas of arable land can be managed using a database in accordance with the invention.

What is claimed is:

1. A method for handling a computer database system containing objects that extend into a coordinate system representing a multidimensional reality, the coordinate system being divisible into a plurality of defined, multidimensional intervals, the method comprising:

determining, each time an object is entered into the database, multidimensional intervals into which the object at least partly extends;

determining, for each of the intervals, the number of objects at least partly extending into the interval;

comparing the determined number of objects with a predetermined threshold value; and dividing, if the threshold value is exceeded, the interval into at least two smaller intervals of equal dimensions, in order to limit the number of objects at least partly extending into any interval.

2. A method as claimed in claim 1, further comprising the step of linking each interval to a set of objects at least partly extending into the interval.

3. A method as claimed in claim 1, further comprising the step of linking each object to a set of intervals into which the object at least partly extends.

4. A method as claimed in claim 1, wherein the coordinate system comprises at least one time dimension.

5. A method as claimed in claim 1, wherein the coordinate system comprises at least spatial dimension.

6. A method as claimed in claim 1, further comprising the step of adjusting the division of intervals when an object is removed from the coordinate system.

7. A method as claimed in claim 2, further comprising the step of linking each object to a set of intervals into which the object at least partly extends.

8. A method as claimed in claim 2, wherein the coordinate system comprises at least one time dimension.

9. A method as claimed in claim 3, wherein the coordinate system comprises at least one time dimension.

10. A method as claimed in claim 7, wherein the coordinate system comprises at least one time dimension.

11. A method as claimed in claim 2, wherein the coordinate system comprises at least spatial dimension.

12. A method as claimed in claim 3, wherein the coordinate system comprises at least spatial dimension.

13. A method as claimed in claim 7, wherein the coordinate system comprises at least spatial dimension.

14. A method as claimed in claim 5, wherein the coordinate system comprises three spatial dimensions.

15. A method as claimed in claim 2, further comprising the step of adjusting the division of intervals when an object is removed from the coordinate system.

16. A method as claimed in claim 3, further comprising the step of adjusting the division of intervals when an object is removed from the coordinate system.

17. A method as claimed in claim 7, further comprising the step of adjusting the division of intervals when an object is removed from the coordinate system.

18. A method for handling a computer database system containing objects that extend into a coordinate system representing a multidimensional reality, the coordinate system being divisible into a plurality of defined, multidimensional intervals, the method comprising:
- determining, each time an object is entered into the database, multidimensional intervals into which the object at least partly extends;
- determining, for each of the intervals, the number of extending into the interval;
- comparing the determined number of objects with a predetermined threshold value in each interval in which the object has an extension; and
- dividing each interval for which the threshold value is exceeded into at least two smaller intervals, in order to limit the number of objects at least partly extending into any interval.

19. The method of claim 18, wherein, when the threshold value is exceeded the interval is divided into at least two intervals of equal dimensions.

20. A computer database system including a memory containing objects that extend into a coordinate system representing a multidimensional reality, the coordinate system being divisible into a plurality of defined, multidimensional intervals,
said database system comprising:
- means for determining, each time an object is entered into the database, multidimensional intervals into which the object at least partly extends;
- means for determining, for each of these intervals, the number of objects extending into the interval;
- means for comparing said number of objects with a predetermined threshold value in each interval in which the object has an extension; and
- means for dividing each interval for which the threshold value is exceeded into at least two smaller intervals, in order to limit the number of objects at least partly extending into any interval.

21. The computer database system of claim 20, wherein, when the threshold value is exceeded the interval is divided into at least two intervals of equal dimensions.

* * * * *